United States Patent
Kobayashi et al.

(10) Patent No.: US 6,403,502 B1
(45) Date of Patent: *Jun. 11, 2002

(54) HEAT TREATMENT METHOD FOR A SILICON WAFER AND A SILICON WAFER HEAT-TREATED BY THE METHOD

(75) Inventors: Norihiro Kobayashi; Satoshi Oka; Takao Abe, all of Gunma-ken (JP)

(73) Assignee: Shin-Etsu Handotai Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/046,996

(22) Filed: Mar. 24, 1998

(30) Foreign Application Priority Data

Mar. 27, 1997 (JP) ............................................. 9-092952

(51) Int. Cl.[7] ............................................. H01L 21/324
(52) U.S. Cl. ..................... 438/795; 438/799; 438/905
(58) Field of Search ................................. 438/795, 799, 438/905–906, 773, 774

(56) References Cited

U.S. PATENT DOCUMENTS 5,360,769 A 11/1994 Thakur et al.
5,506,178 A * 4/1996 Suzuki et al. ............... 438/773

FOREIGN PATENT DOCUMENTS

| EP | 0915 502 | 5/1999 |
| JP | 7161707 | * 6/1995 |
| JP | 409232325 | * 9/1997 |

OTHER PUBLICATIONS

C. Maddalon–Vinante et al., "Influence of rapid thermal annealing and internal gettering on Czochralski–grown silicon. I. Oxygen precipitation," *J. Appl. Phys.*, 79 (5), Mar. 1, 1996.

European Search Report dated Sep. 23, 1999 for application serial No. 98302245.

* cited by examiner

*Primary Examiner*—Charles Bowers
*Assistant Examiner*—Thanh Nguyen
(74) *Attorney, Agent, or Firm*—Hogan & Hartson, L.L.P.

(57) ABSTRACT

There is disclosed a heat treatment method for a silicon wafer in which the silicon wafer is heat treated in a reducing atmosphere through use of a rapid heating/rapid cooling apparatus. The silicon wafer is heat treated for a period of 1 to 60 seconds at a temperature in the range of 1200° C. to the melting temperature of silicon. The heat treatment method can reduce the density of COPs and micro-defects which serve as nuclei of oxidation induced stacking faults at the surface of the silicon wafer.

4 Claims, 6 Drawing Sheets

HEAT TREATMENT METHOD FOR A SILICON WAFER AND A SILICON WAFER HEAT-TREATED BY THE METHOD

BACKGROUND OF THE INVENTION

1. Field of the Invention

The present invention relates to a heat treatment method for a silicon wafer, and more particularly to a heat treatment method which can reduce the density of crystal originated particles (COPs) and micro-defects which serve as nuclei of oxidation induced stacking faults at the surface of a silicon wafer, as well as to a silicon wafer heat-treated by the method.

2. Description of the Related Art

In order to improve electric characteristics of a silicon wafer such as oxide-film dielectric breakdown voltage and leakage current, the surface layer portion of the wafer—on which semiconductor devices are fabricated—must be made defect free. Various methods for heat-treating silicon wafers in various ways have been proposed in order to form a defect-free layer at the surface of the silicon wafer to thereby obtain a so-called intrinsic gettering effect. Among them, there has been generally employed a method in which a silicon wafer is subjected to low-temperature heat treatment at a temperature of 650° C.–700° C. for a few hours and then subjected to high-temperature heat treatment at a temperature of 1150° C.–1200° C. for four hours in a reducing atmosphere such as a 100%-hydrogen atmosphere.

In such a conventional method, although a defect-free layer can be formed at the surface of a silicon wafer, the high-temperature heat treatment requires over 1 hour, resulting in low productivity. Also, oxide precipitate is generated in the wafer, and the oxide precipitate causes warp and slip dislocation in a subsequent device-fabricating process.

Moreover, in the conventional method, since heat treatment is performed in batch through use of a so-called vertical type furnace, a large amount of hydrogen must be caused to flow through the furnace, resulting in an increased level of danger.

In order to solve the above-described problems, there have been proposed inventions as shown in, for example, Japanese Patent Application Laid-Open (kokai) No. 7-161707. In the invention disclosed in this publication, an apparatus capable of rapid heating and rapid cooling (hereinafter referred to as a "rapid heating/rapid cooling apparatus") is used in order to improve the oxide-film dielectric breakdown voltage of a wafer through heat treatment that is performed for a short period of time; for example, 1–60 seconds, within a relatively low temperature range of 950° C.–1200° C.

In this method, since wafers are treated in so-called single wafer processing, the heat treatment can be completed within a short period of time to thereby improve productivity, and problems stemming from generation of oxide precipitate do not occur. Further, since the volume of the chamber is small, the amount of hydrogen gas to be used can be reduced to thereby enhance safety and eliminate necessity for a special apparatus.

Meanwhile, micro-defects which are generated due to precipitation of oxygen or the like and which serve as nuclei of oxidation induced stacking faults and COPs (Crystal Originated Particles) have recently been cited as a cause of decreasing the yield of a device-fabricating process.

Oxidation induced stacking faults are originated from micro-defects introduced during crystal growth and serving as nuclei and appear in an oxidation step or the like of a device fabricating process, becoming a cause of failures such as an increased leakage current of fabricated devices. COP is one type of crystal defect that is introduced in a crystal during the growth thereof and is known to be a defect having a regular octahedron structure.

When a silicon wafer subjected to mirror-polishing is cleaned through use of a mixture solution of ammonia and hydrogen peroxide, pits are formed in the wafer surface. When the number of particles on the wafer is measured through use of a particle counter, pits are also detected and counted as particles together with real particles. The thus-detected pits are called "COPs" in order to distinguish them from the actual particles.

Although there are many opinions in relation to the effects of COPs, COPs existing at the surface of a wafer are known to deteriorate the electric characteristics of the wafer.

For example, a time dependent dielectric breakdown (TDDB) of oxide film, one important electric characteristic of a semiconductor device determined through a reliability test, is known to be related to COPs, and therefore reduction of COPs is required in order to improve the time dependent dielectric breakdown.

Also, COPs are said to affect an ordinary time zero dielectric breakdown (TZDB) of oxide film.

Moreover, COPs are said to adversely affect the device-fabricating process. That is, if a COP exists at the surface of a wafer, a step is formed during a wiring process, and the thus-formed step causes breakage of wiring, resulting in a decrease in yield.

Since wafers are subjected to many heat treatment processes during the manufacture of semiconductor devices, COPs may be generated after any one of the heat treatments. Especially, it has been known that when a wafer is subjected to wet oxidization at 1050° C. for 30 to 240 minutes, COPs are likely to be generated.

As described above, reduction of COPs and micro-defects which serve as nuclei of oxidation induced stacking faults has recently become necessary in order to improve electric characteristics of silicon wafers.

In the conventional technique disclosed in Japanese Patent Application Laid-Open No. 7-161707, heat treatment conditions are determined in consideration of oxide-film dielectric breakdown voltage and no investigation is conducted as to COPs and micro-defects which serve as nuclei of oxidation induced stacking faults at the surface of a wafer, which directly affect the electric characteristics of a resultant device. Although in the embodiment of the invention disclosed in this publication the BMD density of a wafer is taken into consideration, COPs at the wafer surface are not considered.

The results of an experiment conducted by the present inventors reveal that under the conventional heat treatment method disclosed in Japanese Patent Application Laid-Open No. 7-161707, oxide-film dielectric breakdown voltage can be improved to some extent, but COPs cannot be reduced to a sufficient level, so that sufficient improvement is not achieved for electric characteristics other than oxide-film dielectric breakdown voltage.

That is, when a silicon wafer was subjected to hydrogen heat treatment for 30 seconds at 1050° C., which is within the temperature range of the conventional technique, the number of COPs did not decrease, and haze that represents the roughness of the wafer surface sometimes deteriorated due to etching of silicon by hydrogen. Further, even when heat treatment was conducted at 1100° C., a sufficient result was not obtained in terms of elimination of COPs, like in the above-described case. From the above, it was found that under the heat treatment conditions employed in the conventional technique, COPs cannot be reduced sufficiently.

SUMMARY OF THE INVENTION

The present invention has been accomplished to solve the above-mentioned problems, and an object of the present invention is to provide a heat treatment method for a silicon wafer in which a silicon wafer is subjected to heat treatment in a reducing atmosphere through use of a rapid heating/rapid cooling apparatus and which can reduce the density of COPs and micro-defects which serve as nuclei of oxidation induced stacking faults at the surface of a silicon wafer.

The heat treatment method can improve not only oxide-film dielectric breakdown voltage but also other electric characteristics such as electrical reliability and leakage current, and also can make the best use of advantages peculiar to the rapid heating/rapid cooling apparatus; i.e., enhancement of productivity and reduction in the amount of hydrogen gas to be used.

To achieve the above object, the present invention provides a heat treatment method for a silicon wafer in which a silicon wafer is heat treated in a reducing atmosphere through use of a rapid heating/rapid cooling apparatus. The method is characterized in that the silicon wafer is heat treated for a period of 1 to 60 seconds at a temperature in the range of 1200° C. to the melting temperature of silicon.

In the heat treatment method for heat treating a silicon wafer in a reducing atmosphere through use of a rapid heating/rapid cooling apparatus, when the silicon wafer is heat treated at a temperature in the range of 1200° C. to the melting temperature of silicon, which is higher than the temperature range used in the conventional method, COPs and micro-defects which serve as nuclei of oxidation induced stacking faults can be reduced, and thus not only oxide-film dielectric breakdown voltage but also other electric characteristics such as electrical reliability and leakage current can be improved.

In this case, the reducing atmosphere is preferably a 100%-hydrogen atmosphere or a mixed atmosphere of hydrogen and argon, because COPs can be reduced effectively through use of such a reducing atmosphere.

In the present invention, the time duration for heat treatment can be shortened to a period of 1 to 30 seconds, which is shorter than that in the conventional method. Since heat treatment is performed at a high temperature, COPs and micro-defects which serve as nuclei of oxidation induced stacking faults can be reduced sufficiently through heat treatment for a period as long as 30 seconds.

In a silicon wafer subjected to the heat treatment according to the present invention, the density of COPs can be reduced to a sufficient level. For example, when the number of COPs in each 8-inch wafer is considered, the number of COPs decreases to 50 or less. Therefore, characteristics of a resultant device are improved, and yield of the device is increased.

As described above, in the present invention, since a silicon wafer can be subjected to high-temperature heat treatment in a reducing atmosphere through use of a rapid heating/rapid cooling apparatus to thereby reduce COPs and micro-defects which serve as nuclei of oxidation induced stacking faults in the surface layer of the silicon wafer, wafers having excellent electric characteristics can be obtained. That is, even when COPs and micro-defects which serve as nuclei of oxidation induced stacking faults are introduced into a silicon monocrystal during growth thereof and/or into a wafer during heat treatment subsequent to the growth of the silicon monocrystal, the COPs and micro-defects which serve as nuclei of oxidation induced stacking faults can be eliminated by the heat treatment of the present invention.

Since a silicon wafer subjected to the heat treatment according to the present invention has a reduced number of defects at the surface thereof, such a silicon wafer can also be used for the purpose of particle monitoring.

Moreover, since a rapid heating/rapid cooling apparatus for single-wafer processing is used, oxygen precipitation occurs to a lesser extent compared to the case of batch type heat treatment such as a conventional intrinsic gettering heat treatment. Therefore, warping of wafers, generation of slip dislocation, and other related problems can be solved. In addition, the heat treatment processing can be completed within a shortened period of time, so that productivity is improved.

DESCRIPTION OF THE INVENTION AND A PREFERRED EMBODIMENT

The present invention will be further described below in detail, but is not limited thereto.

The present inventors carried out various experimental studies to find heat treatment conditions that can reduce the density of COPs existing at the surface of a silicon wafer, and found that when heat treatment is performed at a temperature within a higher temperature range than that used in conventional heat treatment, the density of COPs and micro-defects which serve as nuclei of oxidation induced stacking faults can be decreased to thereby obtain a silicon wafer having a reduced defect density. The present invention was accomplished based on this finding.

That is, the density of COPs and micro-defects which serve as nuclei of oxidation induced stacking faults of a silicon wafer can be greatly decreased when the silicon wafer is subjected to heat treatment which uses a rapid heating/rapid cooling apparatus and in which the silicon wafer is heat treated for a period of 1 to 60 seconds at a temperature in the range of 1200° C. to the melting temperature of silicon and in a reducing atmosphere of 100%-hydrogen or a mixture of hydrogen and argon. Especially, the above-described heat treatment conditions can reduce the COP density of the wafer to substantially zero. If the number of COPs at the surface of a silicon wafer can be decreased to a level corresponding to 50 COPs per 8-inch wafer, not only oxide-film dielectric breakdown voltage but also other electric characteristics such as oxide-film time dependent dielectric breakdown (TDDB) can be improved.

Further, since a silicon wafer manufactured according to the method of the present invention contains no COPs, the silicon wafer can be advantageously used for particle monitoring.

Moreover, use of a rapid heating/rapid cooling apparatus allows rapid heating and rapid cooling of a silicon wafer, so that the heat treatment can be completed within a shortened period of time to thereby enhance productivity, and problems involved in the conventional heat treatment such as wafer warp and slip dislocation can be solved.

An embodiment of the present invention will now be described with reference to the drawings.

An example of an apparatus which can heat and cool a silicon wafer rapidly is a heat radiating apparatus such as a lamp heater disclosed in the above-described prior art. An example of commercially available heat radiating apparatuses is SHS-2800 (product of AST corp.). These apparatuses are neither extremely complicated nor expensive.

First, a description will be given of a rapid hating/rapid cooling apparatus used in the present invention with reference to FIG. 1.

Figure 1:
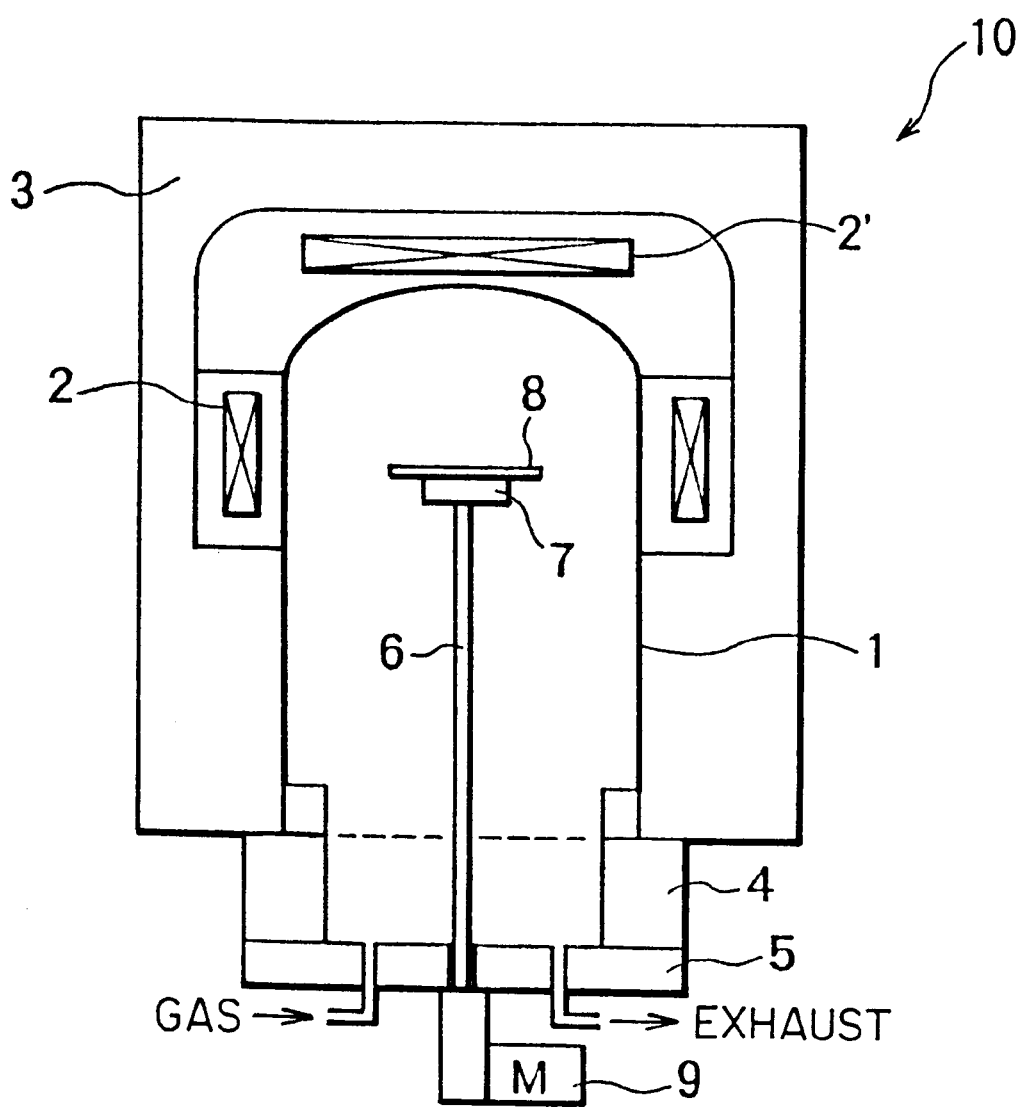
FIG. 1 is a schematic sectional view showing an example of a heat treatment furnace which can heat and cool a silicon wafer rapidly.

A heat-treatment furnace 10 shown in FIG. 1 includes a bell jar 1 which is formed from, for example, silicon carbide or quartz and in which a wafer is heat-treated. Heaters 2 and 2' surround the bell jar 1 so as to heat the bell jar 1. The heater 2' is separated from the heater 2 along a vertical direction. Also, power supplied to the heater 2' is independent of that to the heater 2 for independent power control between the heaters 2 and 2'. The heating method is not limited thereto, but so-called radiation heating and induction heating may also be applicable. The bell jar 1 and the heaters 2 and 2' are housed in a housing 3 serving as a heat shield.

A water-cooled chamber 4 and a base plate 5 are arranged at the lower portion of a furnace so as to isolate the interior of the bell jar 1 from the atmosphere. A wafer 8 is held on a stage 7, which is attached to the top end of a support shaft 6, which, in turn, is moved vertically by means of a motor 9. In order to load a wafer into or unload from the furnace along a horizontal direction, the water-cooled chamber 4 has an unillustrated wafer port which is opened and closed by means of a gate valve. A gas inlet and a gas outlet are provided in the base plate 5 so that the gas atmosphere within the furnace can be adjusted.

In the heat treatment furnace 10 having the above-described structure, heat treatment for rapid heating/rapid cooling of a silicon wafer is carried out in the procedure described below.

First, the interior of the bell jar 1 is heated to a desired temperature in a temperature range of 1200° C. to the melting temperature of silicon by the heaters 2 and 2' and is then held at the desired temperature. Through mutually independent control on power supplied to the heaters 2 and 2', a temperature distribution can be established within the bell jar 1 along a vertical direction. Accordingly, the heat-treatment temperature of a wafer is determined by the position of the stage 7, i.e. the amount of insertion of the support shaft 6 into the furnace.

In a state in which the interior of the bell jar 1 is maintained at a desired temperature, a wafer is inserted into the water-cooled chamber 4 through the wafer port by an unillustrated wafer handling apparatus arranged next to the heat treatment furnace 10. The inserted wafer is placed in, for example, an SiC boat provided on the stage 7 which is situated at the bottom standby position. Since the water-cooled chamber 4 and the base plate 5 are water-cooled, the wafer located at this standby position is not heated to a high temperature.

Upon completion of placing the wafer on the stage 7, the motor 9 is immediately driven to insert the support shaft 6 into the furnace so that the stage 7 is raised to a heat treatment position where a desired temperature in the range of 1200° C. to the melting temperature of silicon is established (hereinafter referred to as the "desired temperature position"), thereby heat-treating the wafer at the temperature. In this case, since only approximately 20 seconds, for example, is required for moving the stage 7 from the bottom standby position in the water-cooled chamber 4 to the heat treatment position, the silicon wafer is heated quickly.

The stage 7 is halted at the desired temperature position for a predetermined time (1 to 60 seconds), thereby subjecting the wafer to high-temperature heat treatment over the halting time. Upon elapse of the predetermined time to complete high-temperature heat treatment, the motor 9 is immediately driven to withdraw the support shaft 6 from the interior of the furnace to thereby lower the stage 7 to the bottom standby position in the water-cooled chamber 4. This lowering motion can be completed in approximately 20 seconds, for example. The wafer on the stage 7 is quickly cooled, since the water-cooled chamber 4 and the base plate 5 are water-cooled. Finally, the wafer is unloaded from inside the water-cooled chamber 4 by the wafer handling apparatus, thus completing the heat treatment.

When there are more wafers to be heat-treated, these wafers can be sequentially loaded into and heat-treated in the heat treatment furnace 10 maintained at a predetermined high temperature.

EXAMPLE

Next, the present invention will be described by way of example.

Example 1, Comparative Example 1

Through use of the above-described rapid heating/rapid cooling apparatus, silicon wafers were heat treated in a single-wafer processing scheme in a 100%-hydrogen atmosphere. The heat treatment was conducted in a temperature range of 1000° C. to 1300° C. for a period of time ranging from 1 to 30 seconds. The wafers used in the present example were sliced in a commonly practiced manner from a silicon ingot that had been manufactured in accordance with the Czochralski method and were then subjected to mirror-polishing. The wafers each had a diameter of 8 inches and a <100> orientation.

The density of COPs at the surface of each silicon wafer was measured before the silicon wafer was subjected to heat treatment. The results of the measurement revealed that about 380 COPs existed on the surface of each wafer. The COP measurement was conducted in an ordinary manner through use of a particle counter Model LS-6000 (trade name, product of Hitachi Electronics Engineering Corp.) in which particles and COPs having sizes in a range of 0.12 to 0.20 μm were measured at a 700-volt range.

Figure 2:
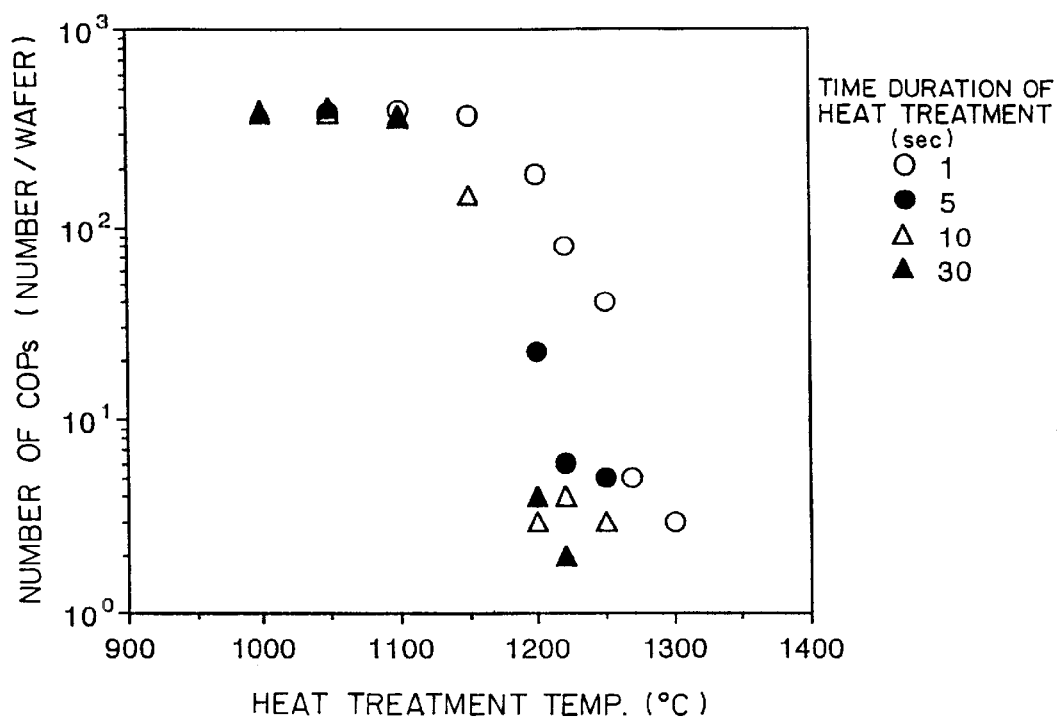
FIG. 2 is a graph showing the relationship between heat treatment temperatures and the number of COPs after heat treatment by the rapid heating/rapid cooling apparatus.

FIG. 2 shows the relationship between the number of COPs after the wafer was subjected to heat treatment and the heat treatment temperature. As is apparent from the test results, the number of COPs decreases greatly when the heat treatment temperature is elevated to 1200° C. or higher. In this case, the number of COPs decreases as the heat treatment temperature increases. Further, the number of COPs decreases greatly when the time duration of the heat treatment is increased to 1 second or longer. In this case, the number of COPs decreases as the time duration of the heat treatment increases.

Since the number of COPs at the surface of each wafer can be decreased to a level of only a few, the device characteristics and the like are expected to be improved greatly. Heat treatment over a period as long as 30 seconds is sufficient. Although the heat treatment may be performed for about 60 seconds in order to introduce a factor of safety, heat treatment over a period of time longer than 60 seconds is not preferable because waste process time increases.

By contrast, in the conventional heat treatment performed at 1200° C. or less, the density of COPs hardly decreased.

From above, it is understood that the effect of reducing COPs existing at the surface of a wafer is enhanced with an increase in heating temperature and with an increase in processing time within the range of 1 to 30 seconds.

Example 2, Comparative Example 2

Next, an investigation was conducted on the effect of the invention in improving electric characteristics.

First, silicon wafers were heat treated in a hydrogen atmosphere under the same conditions as those in the above-described case, except that the heating temperature was set to 1200° C. or 1220° C. and the time duration of the heat treatment was varied in the range of 1 to 10 seconds. Each wafer was measured to determine the oxide-film time zero dielectric breakdown (TZDB) and oxide-film time dependent dielectric breakdown (TDDB) thereof. For comparison, the TZDB and TDDB of a wafer which had not undergone heat treatment (as-received wafer) were measured. The test results are shown in FIGS. 3 and 4.

TZDB was measured through use of a Model 4142B of Hewlett Packard, Ltd., while TDDB was measured through use of a MI-477S of Sannwa Corp.

Figure 3:
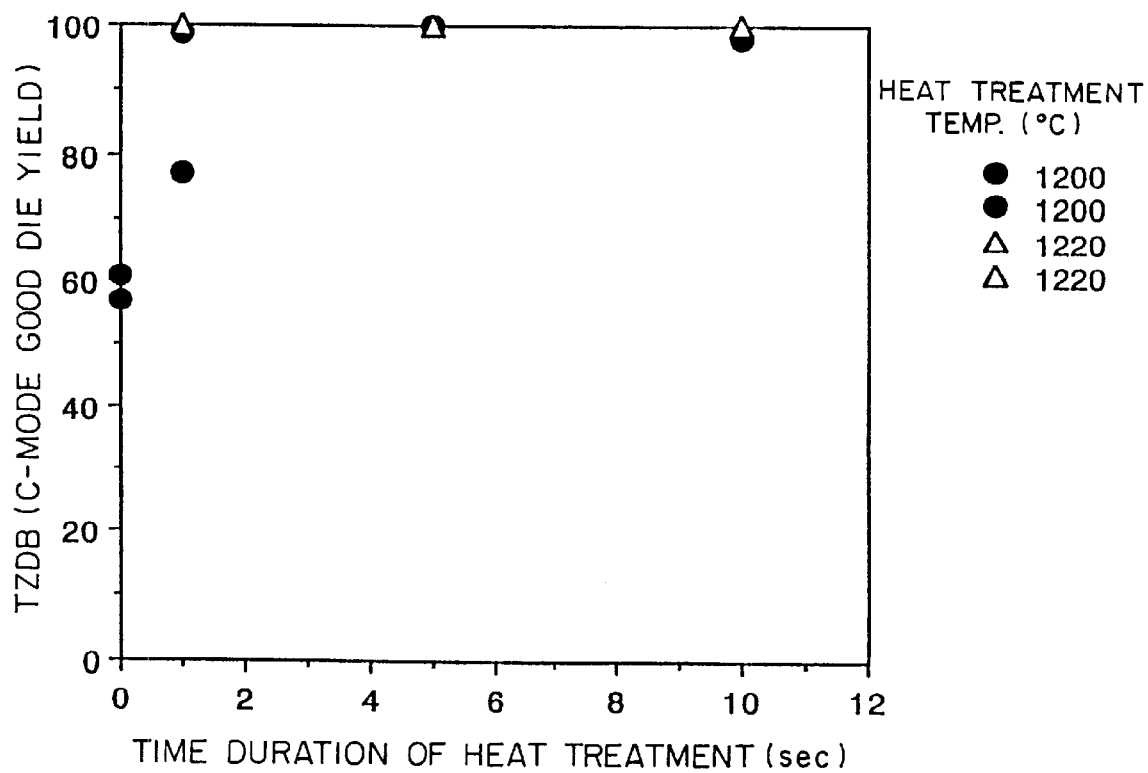
FIG. 3 is a graph showing the relationship between oxide-film time zero dielectric breakdown (TZDB) and the time duration of heat treatment.
Figure 4:
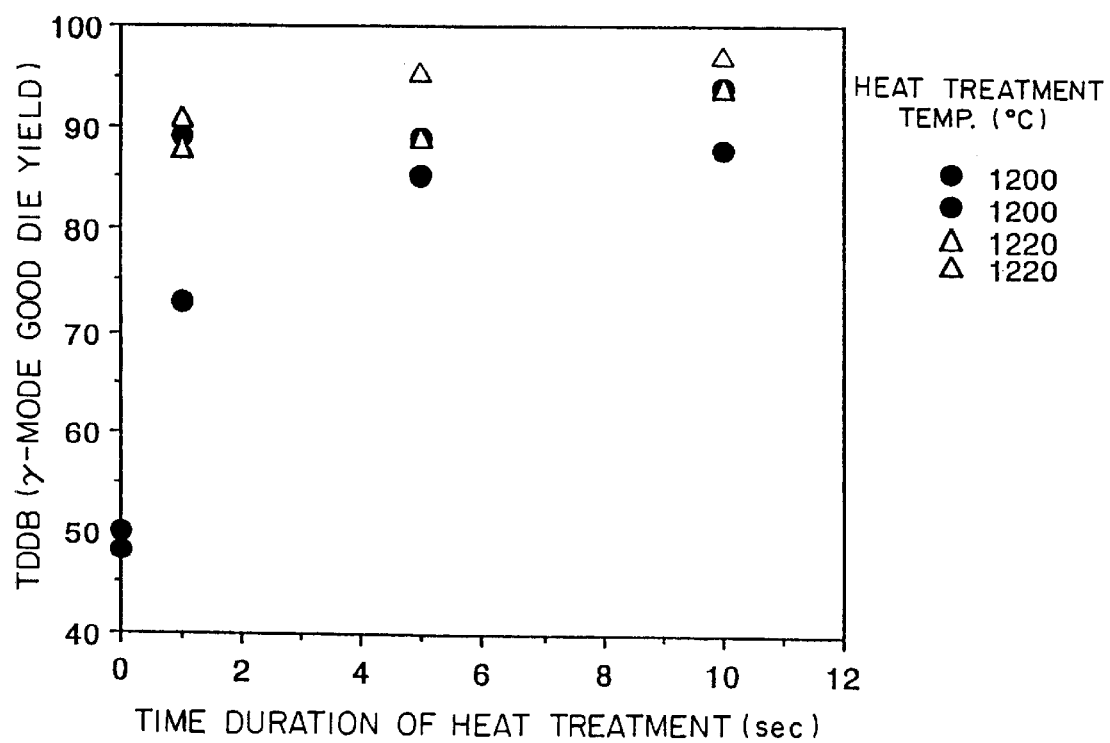
FIG. 4 is a graph showing the relationship between oxide-film time dependent dielectric breakdown (TDDB) and the time duration of heat treatment.

FIG. 3 shows the relationship between oxide-film time zero dielectric breakdown (TZDB) and the time duration of heat treatment.

As is apparent from FIG. 3, the C-mode good die yield (>8 MV/cm) was increased to 100% when hydrogen heat treatment was performed at 1200° C. for 5 seconds or more. Especially, in the case where the heating temperature was set to 1220° C., a good result was obtained even when the heat treatment was performed only for one second. This demonstrates that the heat treatment of the present invention improves oxide-film dielectric breakdown voltage drastically.

By contrast, in the case of wafers which had not undergone heat treatment (time duration of heat treatment was zero), the good die yield in terms of oxide-film dielectric breakdown was as low as about 60%.

FIG. 4 shows the relationship between oxide-film time dependent dielectric breakdown (TDDB) and the time duration of heat treatment.

As is apparent from FIG. 4, with regard to the oxide-film time dependent dielectric breakdown (TDDB), the good die yield (>25 C/cm$^2$) was greatly increased by the heat treatment of the present invention. Especially, in the case where the heating temperature was set to 1220° C., a good result was obtained even when the heat treatment was performed for only one second.

By contrast, in the case of wafers which had not undergone heat treatment (time duration of heat treatment was zero), the good die yield in terms of the oxide-film time dependent dielectric breakdown was as low as about 50%.

As described above, in the present invention, since wafers are heat treated at a temperature higher than that conventionally used, the density of COPs can be decreased; i.e., the COPs can be eliminated. As a result, electric characteristics of wafers can be improved in terms of not only oxide-film dielectric breakdown voltage but also electrical reliability.

Example 3, Comparative Example 3

Incidentally, the process for fabricating semiconductor devices includes many heat treatment processes in which COPs may be generated. In view of the above, a heat treatment process in which COPs are generated easily was intentionally added to the fabricating process in order to confirm the effectiveness of the present invention. That is, measurement was conducted in order to determine how the electric characteristics of a silicon wafer that had undergone high-temperature hydrogen heat treatment of the present invention would change when the silicon wafer was further subjected to oxidizing heat treatment in which COPs are generated easily.

The heat treatment performed by the rapid heating/rapid cooling apparatus was performed at a temperature in the range of 1000° C. to 1220° C., while the time duration of the heat treatment was fixed at 10 seconds. The heat-treated wafers were then subjected to oxidizing heat processing under conditions that were known to be likely to generate COPs; i.e., at 1050° C. for 30 minutes or at 1050° C. for 240 minutes.

Measurement was performed for these wafers in the same manner as that used in the above-described case in order to determine the oxide-film time zero dielectric breakdown (TZDB) and oxide-film time dependent dielectric breakdown (TDDB) thereof. For comparison, the TZDB and TDDB of a wafer for which only hydrogen heat treatment was performed, that is, oxidizing heat treatment was not performed, were measured. The test results are shown in FIGS. 5 and 6.

Figure 5:
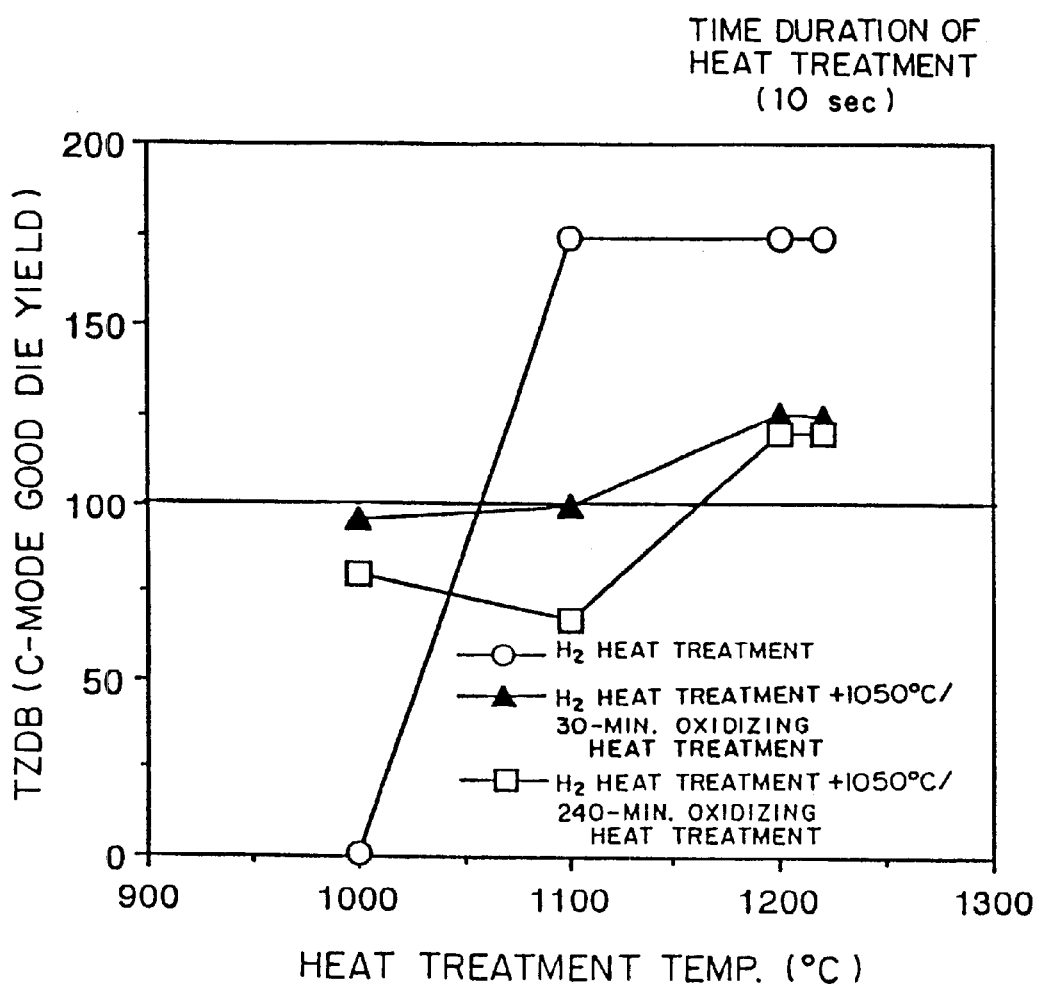
FIG. 5 is a graph showing the results of an investigation on an influence of oxidizing heat treatment to oxide-film time zero dielectric breakdown (TZDB)
Figure 6:
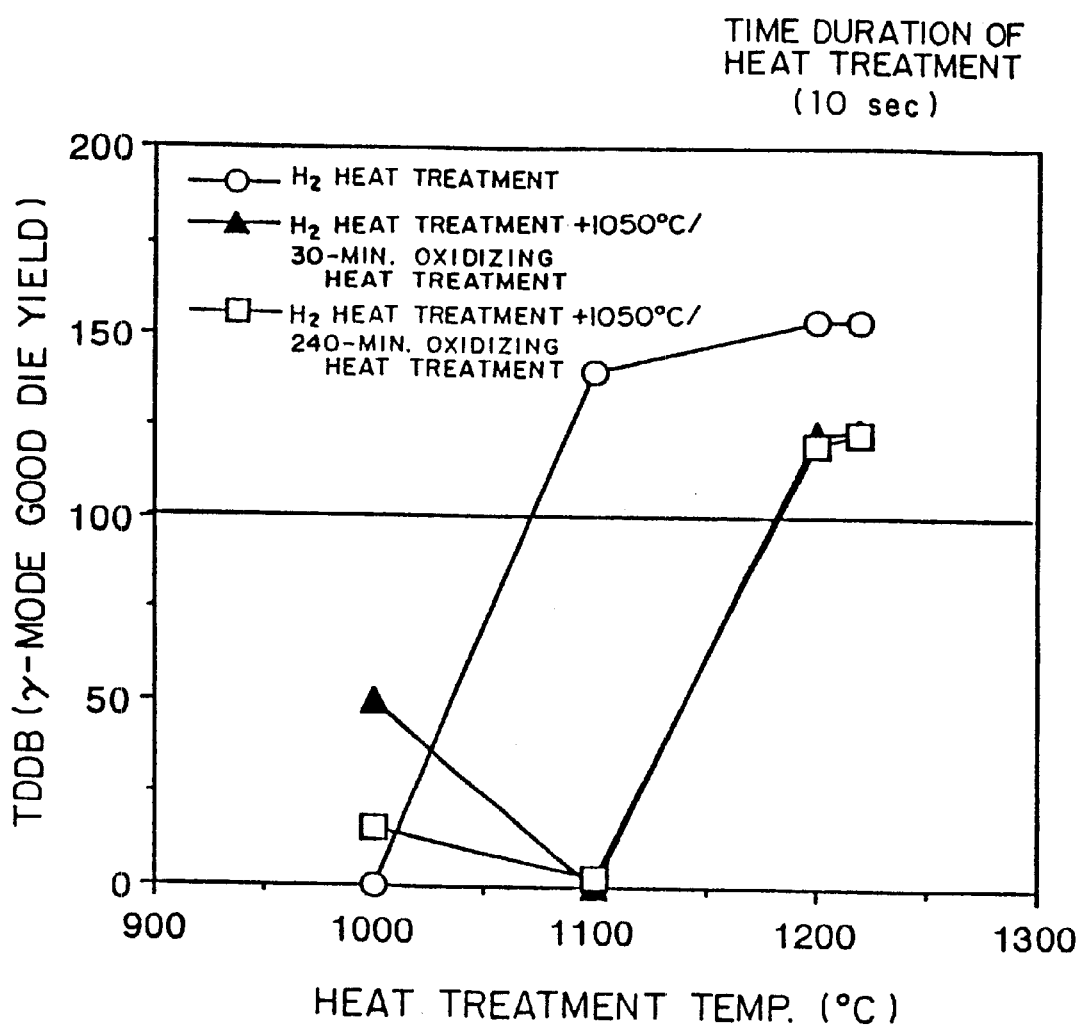
FIG. 6 is a graph showing the results of an investigation on an influence of oxidizing heat treatment to oxide-film time dependent dielectric breakdown (TDDB).

In FIGS. 5 and 6, the good die yield (in terms of TZDB and TDDB) of a wafer subjected only to oxidizing heat treatment at 1050° C. for 240 minutes is shown as 100, and TZDB and TDDB (vertical axis) are normalized with respect to this value.

As is apparent from the graph, in the case where oxidizing heat treatment was not performed; i.e., in the case where only hydrogen heat treatment was performed, both TZDB and TDDB are improved remarkably when the hydrogen heat treatment was performed at 1100° C. or a higher temperature.

It is also found that when the oxidizing heat treatment in which COPs are generated easily is added after the hydrogen heat treatment, the good die yield decreases drastically. This drastic decrease in the good die yield is considered to occur due to generation of COPs. However, in the case where wafers were subjected to the heat treatment of the present invention in which the heating temperature was set to a temperature higher than 1200° C., the decrease in good die yield after the oxidizing heat treatment was smaller. Especially, the good die yield in terms of TDDB of wafers heat treated at 1100° C. decreased to zero due to the oxidizing heat treatment, whereas the good die yield in terms of TDDB of wafers subjected to the high-temperature heat treatment of the present invention decreased only a small extent due to the oxidizing heat treatment.

The above test results demonstrate that the high-temperature heat treatment of the present invention can improve electric characteristics such as TZDB and TDDB of wafers after heat treatment, and that the effect continues until the wafers are subjected to a device-fabricating process. Further, even when the device-fabricating process includes oxidizing heat treatment in which COPs are generated easily, COPs are generated to a lesser extent compared to the case where wafers are subjected to the conventional heat treatment, so that generation of COPs is effectively prevented and good electric characteristics are maintained.

Example 4

Subsequently, there was examined the effect of the present invention in reducing micro-defects which serve as nuclei of oxidation induced stacking faults.

Through use of the above-described rapid heating/rapid cooling apparatus, silicon wafers were heat treated in a single-wafer processing scheme in a 100%-hydrogen atmosphere and in a mixed atmosphere of hydrogen and argon (1:1). The heat treatment was conducted at 1250° C. for 10 seconds.

The wafers used in the present example were sliced in a commonly practiced manner from a silicon ingot that had been manufactured in accordance with the Czochralski method and were then subjected to mirror-polishing. The wafers each had a diameter of 8 inches and a <100> orientation. However, during the crystal growth in accordance with the Czochralski method, the growth rate was intentionally decreased to 60% of the ordinary rate in order to manufacture the crystal under conditions where many oxidation induced stacking faults would be generated.

The density of oxidation induced stacking faults at the surface of each silicon wafer was measured before the silicon wafer was subjected to the heat treatment according to the present invention. The results of the measurement reveal that faults existed at the surface of the wafer at a density of up to 2667 faults/cm$^2$.

The density of oxidation induced stacking faults was measured in an ordinary manner. That is, each wafer was subjected to pyrogenic oxidation at 1100° C. for 60 minutes; and the surface of the wafer was removed in an amount of 10 microns through etching in Secco solution (mixture of dichromic acid, hydrofluoric acid, and water); and the surface was observed through a microscope to count the oxidation induced stacking faults.

In the wafers subjected to the heat treatment according to the present invention, the maximum density of oxidation induced stacking faults was 127 faults/cm$^2$, and a drastic reduction in density was observed. From this, it is apparent that micro-defects serving as nuclei of oxidation induced stacking faults in the wafer disappeared. The reduction of the micro-defects serving as nuclei of oxidation induced stacking faults tended to occur more effectively in the case where the heat treatment was conducted in a mixed atmosphere of hydrogen and argon, compared with the case where heat treatment was conducted in a 100%-hydrogen atmosphere. However, no big difference was observed.

The present invention is not limited to the above-described embodiment. The above-described embodiment is a mere example, and those having the substantially same structure as that described in the appended claims and providing the similar action and effects are included in the scope of the present invention.

For example, in the above-described embodiment, a heat treatment furnace as shown in FIG. 1 is used. However, the present invention is not limited thereto. In principle, any furnace may be used so long as it can heat and cool silicon wafers rapidly and can heat the wafers to a temperature of 1200° C. or higher.

Although the heat treatment of the present invention has been described as taking place in a reducing atmosphere (a 100%-hydrogen atmosphere or a mixed atmosphere of hydrogen and argon), the present invention is not limited thereto and encompasses a case where a heat treatment is performed in an inert gas atmosphere such as a 100% argon atmosphere. In such a case, the same effect can also be achieved.

What is claimed is:

1. A heat treatment method for silicon wafer, comprising the step of decreasing COPs in a silicon wafer by heat treatment in a reducing atmosphere in single wafer processing for a period of 1 to 60 seconds at a temperature in the range of higher than 1200° C. to the melting temperature of silicon.

2. A heat treatment method for a silicon wafer according to claim 1, wherein said reducing atmosphere is a 100%-hydrogen atmosphere or a mixed atmosphere of hydrogen and argon.

3. A heat treatment method for a silicon wafer according to claim 1, wherein the time duration for heat treatment is set to a period of 1 to 30 seconds.

4. A heat treatment method for a silicon wafer according to claim 2, wherein the time duration for heat treatment is set to a period of 1 to 30 seconds.

* * * * *